United States Patent
Van Gastel et al.

(10) Patent No.: US 8,344,739 B2
(45) Date of Patent: Jan. 1, 2013

(54) CAPACITIVE SENSOR ARRAY

(75) Inventors: Peter Van Gastel, Solingen (DE); Iko Lindic, Essen (DE)

(73) Assignee: Huf Hulsbeck & Furst GmbH & Co. KG, Velbert (DE)

( * ) Notice: Subject to any disclaimer, the term of this patent is extended or adjusted under 35 U.S.C. 154(b) by 320 days.

(21) Appl. No.: 12/837,403

(22) Filed: Jul. 15, 2010

(65) Prior Publication Data

US 2011/0012623 A1  Jan. 20, 2011

(30) Foreign Application Priority Data

Jul. 20, 2009 (DE) .......................... 10 2009 027 851

(51) Int. Cl.
*G01R 27/26* (2006.01)
(52) U.S. Cl. .................. 324/658; 324/686; 324/660
(58) Field of Classification Search .................. 324/661, 324/662, 686, 687, 688, 519; 327/517; 345/173, 345/174; 73/780, 862.626
See application file for complete search history.

(56) References Cited

U.S. PATENT DOCUMENTS

| | | | |
|---|---|---|---|
| 3,031,617 A | | 4/1962 | Paquette |
| 3,798,541 A | * | 3/1974 | Campbell et al. ............ 324/72.5 |
| 6,825,752 B2 | * | 11/2004 | Nahata et al. ................ 340/5.64 |
| 7,545,153 B2 | * | 6/2009 | Abe .............................. 324/663 |
| 2004/0149051 A1 | * | 8/2004 | Mieda et al. ............. 73/862.625 |
| 2005/0179445 A1 | * | 8/2005 | Nakano et al. ................ 324/661 |

FOREIGN PATENT DOCUMENTS

| | | |
|---|---|---|
| DE | 40 06 119 C2 | 8/1991 |
| DE | 103 29 138 A1 | 1/2004 |
| FR | 870 681 | 3/1942 |

\* cited by examiner

*Primary Examiner* — Melissa Koval
*Assistant Examiner* — Feba Pothen
(74) *Attorney, Agent, or Firm* — Blakely, Sokoloff, Taylor & Zafman

(57) ABSTRACT

A capacitive sensor array includes a sensor electrode, a shielding electrode and a background electrode which are surrounded by insulator materials and connected to a control and evaluation circuit. The sensor electrode detects the entry of an object into a space ahead of the sensor electrode. The control and evaluation circuit detects a capacity change of the sensor electrode as compared to a reference potential. The shielding electrode is connected to the sensor electrode via the control and evaluation circuit in such a manner that its potential follows. The three electrodes are arranged behind each other. The insulating materials are arrayed between the sensor electrode and the detection zone and include at least one plastic layer that directly surrounds the sensor electrode and a plastic layer.

15 Claims, 2 Drawing Sheets

CAPACITIVE SENSOR ARRAY

BACKGROUND OF THE INVENTION

A capacitive sensor array with a sensor electrode with whose aid the approach of an object is to be detected, and with a control and evaluation circuit that is linked to the sensor electrode and detects a capacity change of the sensor electrode as compared to mass by periodically linking the sensor electrode with an operating voltage at a predetermined frequency and evaluating at least one parameter of a current or voltage progression that is dependent on the periodic charging and discharging of the sensor electrode in order to detect the capacity change is, for example, known in the U.S. Pat. No. 5,730,165 as well as the corresponding patent document DE 196 81 725 B4. The parameter of a current or voltage progression that is dependent on the periodic charging and discharging of the sensor electrode herein consists of a voltage that can be measured over a condenser and depends on a charge that is accumulated in the condenser, wherein this charge is accumulated by periodically charging the sensor electrode by linking it to the operating voltage and subsequently discharging it again by connecting it to the condenser. Another such capacitive sensor is known from the patent document EP 1 339 025 B1.

A capacitive sensor array with a sensor electrode, with a mass background electrode that is mounted with a gap behind the sensor electrode, and with a shielding electrode that is arrayed between the sensor electrode and the mass background electrode and is linked to the sensor electrode via a control and evaluation circuit in such a manner that its potential follows the potential of the sensor electrode is, for example, known from the publications EP 0 518 836 A1, U.S. Pat. No. 6,825,752 B2, DE 101 31 243 C1 and DE 10 2006 044 778 A1. The provision of an shielding electrode between the sensor electrode and the background electrode that is on mass potential as known from these printed documents has the advantage that the sensitivity of the capacitive sensor that is formed in this manner towards changes in the space ahead of the sensor electrode, e.g. by the introduction of objects, is heightened. This is particularly due to the fact that the field which spreads out from the sensor electrode ranges more strongly into the space ahead of the sensor electrode (detection range) because a large part of the field is no longer short circuited to the background electrode that is connected to mass potential, as would be the case if there were no shielding electrode. Due to the circumstance that the shielding electrode is connected to the sensor electrode in such a manner that it follows its potential, a strong electrical field is formed between the shielding electrode and the background electrode; specifically, however, practically no field is formed between the sensor electrode and the shielding electrode whose potential follows.

The known arrangement of a sensor electrode, shielding electrode and background electrode is commonly surrounded with an electrical insulator, such as a plastic layer, so that an insulating layer, such as a plastic layer, is present on the sensor electrode and therefore between the sensor electrode and the space to be monitored ahead of the sensor electrode, namely the detection zone. It has been shown that when such a capacitive sensor array is used in an environment that is burdened with dirt and humidity, e.g. on the exterior of a motor vehicle (e.g. as a proximity sensor in an exterior door handle), undesired capacity changes may occur due to contamination with water or humidity on the outer surface of the plastic coating of the sensor array; in the worst case, this may cause the sensor array to wrongly determine that an object has entered the detection zone in the space ahead of the sensor electrode.

BRIEF SUMMARY OF THE INVENTION

The invention involves a capacitive sensor array with a sensor electrode which is to be used to detect the entry of an object into a space ahead of the sensor electrode, a control and evaluation circuit that is linked to the sensor electrode which detects changes in the capacity of the sensor electrode as compared to a reference potential by periodically charging and discharging the sensor electrode at a predetermined frequency and evaluates at least one parameter of a current or voltage progression that depends on the periodic charging and discharging of the sensor electrode in order to detect the capacity change, a background electrode, a shielding electrode that is arrayed between the sensor electrode and the background electrode and that is linked with the sensor electrode via the control and evaluation circuit in such a manner that its potential basically follows the potential of the sensor electrode, wherein a detection range of the sensor array extends into the space ahead of the sensor electrode.

The invention is therefore based upon the task of preventing or minimizing such an erroneous response that occurs in a sensor array of the initially described type due to moisture contamination of the external sensor surface.

The invention solves this task with a capacitive sensor array possessing the attributes of claim 1.

The capacitive sensor array in accordance with the invention includes a sensor electrode that extends along a first coordinate line, and whose purpose is to detect the entry of an object into a space ahead of the sensor electrode. The coordinate line may, for example, consist of a straight coordinate line of a Cartesian coordinate system; however it may also be arched in space. The capacitive sensor array furthermore possesses a control and evaluation circuit that is linked to the sensor electrode and detects a capacity change in the capacity of the sensor electrode as compared to a reference potential by periodically charging and discharging the sensor electrode with a predetermined frequency and evaluating at least one parameter of a current or voltage progression that is dependent on the periodic charging and discharging of the sensor electrode in order to detect the capacity change. The periodic charging and discharging is, for example, implemented by periodically connecting the sensor electrode at the predetermined frequency to a specified potential, such as the operating voltage potential. The voltage progression may, for example, consist of the voltage progression at the connection of the sensor electrode. The parameter may, for example, consist of a voltage that is measured over a condenser that accumulates a charge, or a specific number of periods of charging and discharging until a switching threshold is exceeded by a voltage measured at the sensor electrode. The capacitive sensor array furthermore possesses a background electrode that is arrayed parallel to the sensor electrode and a shielding electrode that is arrayed between the sensor electrode and the background electrode, which is linked to the sensor electrode via the control and evaluation circuit in such a manner that its potential largely follows the potential of the sensor electrode. The shielding electrode is linked to the sensor electrode via the control and evaluation circuit in such a manner that it does not have any influence on the capacity change of the sensor electrode that is measured in comparison to the reference potential. The term of "following" herein aims to describe that the potential of the shielding electrode must not necessarily be equal to the potential of the sensor electrode, and that there may be a time delay between the progression of the potential of the sensor electrode and the potential of the shielding electrode. The word "largely" furthermore intends to express that the shielding electrode does not have to follow the potential of the sensor electrode throughout the full periods of charging and discharging the sensor electrode; it is sufficient for it to follow this potential at least in partial segments of the periods, for example that it follows the potential of the sensor electrode while the sensor electrode charges, and drops to mass potential while the sensor electrode discharges, while the potential of the sensor electrode still remains at a potential that differs from mass. The background electrode is, for example, set to a constant potential such as mass or operating voltage. Alternatively, the background electrode may be periodically placed on mass and another potential, such as the operating voltage, at the specified frequency, wherein this should preferably occur in a complementary relation to the sensor electrode, as it is, for example, described in the parallel pending patent application by the Applicant with the title "Capacitive sensor array with a sensor electrode, a shielding electrode and a background electrode". The sensor electrode, the shielding electrode and the background electrode are arrayed behind each other along a second coordinate line that is perpendicular to the first coordinate line, wherein a detection area of the sensor array extends in the direction of the second coordinate line into the space ahead of the sensor electrode and into a specified angle zone (a) to both sides of the plane that is formed by the first and second coordinate lines. The sensor electrode is surrounded by insulating materials which are arrayed between the sensor electrode and the detection zone in the manner of a semicircular or semi-elliptical cylinder, wherein the central axis of the cylinder lies within the plane that is formed by the first and second coordinate lines, wherein the insulator materials between the detection zone and the sensor electrode include at least one plastic layer of a first thickness that directly surrounds the sensor electrode and a plastic layer of a second thickness that is arrayed at a specified distance, wherein the insulator materials are arranged so that the relative dielectricity constant initially assumes a relatively high value of the surrounding plastic layer as the distance from the sensor electrode increases, then drops to a value that approaches the value of 1 (for example the value of air), and then again rises to a relatively high value of the outer plastic layer.

It was shown that when a space was specifically created between the plastic layer that forms the contaminated outer surface and the plastic layer that surrounds the sensor electrode with a dielectricity constant that approximates the value of 1, it was possible to reduce or avoid the interfering influences of moisture contamination. At the same time, the arrangement of the insulator materials in accordance with the invention permits a relatively small structural size as compared to a massive plastic layer; that is, relatively small cross-sectional dimensions of the cover of the sensor electrode with the same sensitivity to interference.

A preferred embodiment is represented in that there is a gas filled space between the plastic layer that surrounds the sensor electrode and the outer plastic layer, whose width corresponds to the specified gap and whose relative dielectricity constant approaches a value of 1. This space is, for example, formed by an air gap or several air gaps with radial and/or cylindrical plastic dividing walls. In this embodiment, the desired progression of the relative dielectricity constant is produced in a simple manner. Alternatively or partially, the gas filled space may be formed by a foamed plastic area. For example, both the plastic layer that surrounds the sensor electrode and the outer plastic layer as well as the space between them may be made from a plastic material, wherein the outer areas and the areas that lie against the electrode are almost completely made from the plastic material, and the plastic material is strongly foamed in the gap between them. The plastic layer that surrounds the sensor electrode and/or the outer plastic layer may each consist of several similar or different plastic layers.

In a preferred further embodiment of the invention, the specified distance between the plastic layer that surrounds the sensor electrode and the outer plastic layer lies in the range between 30% and 90%, preferably in the range from 50% to 70%, of the distance of the outer surface of the external plastic layer from the surface of the sensor electrode.

The first thickness, that is the thickness of the plastic layer immediately surrounding the sensor electrode, and the second thickness, that is the thickness of the outer plastic layer that is arranged at a specified gap, preferably lie within the range between 0.2 mm and 2 mm.

The specified distance between the plastic layer that surrounds the sensor electrode and the outer plastic layer preferably lies within the range between 0.5 mm and 10 mm, preferably within the range between 1 mm and 4 mm.

The detection range of the sensor array extends throughout a specified angle zone (a) to both sides of the plane that is formed by the first and second coordinate lines, which preferably lie between 40° and 130° in each case.

In a preferred embodiment, the sensor electrode on the side that faces the shielding electrode as well as the shielding electrode and the background electrode are surrounded by a plastic mantle, wherein the plastic mantle bears the electrodes and fixes their position. The background electrode is, for example, formed as a level plate that is symmetrically arranged at a plane that is perpendicular to the second coordinate line behind the sensor electrode. Herein the background electrode extends to the outer plastic layer of the insulator materials that are arrayed in the form of a semicircular or semi-elliptical cylinder in the direction that is perpendicular to the first and second coordinate lines. Herein the shielding electrode preferably possesses a width in the direction that is perpendicular to the first and second coordinate lines which is greater than that of the sensor electrode, but lesser than that of the background electrode.

In a preferred embodiment of the capacitive sensor array, the specified frequency lies in the range between 50 kHz and 4 MHz, preferably between 100 kHz and 1 MHz.

Advantageous and/or preferred embodiments are described in the Sub-Claims.

BRIEF DESCRIPTION OF THE DRAWINGS

The following text describes the invention in further detail using the preferred exemplary embodiments that are shown in the diagrams. The diagrams show.

DETAILED DESCRIPTION OF THE INVENTION

Figure 1:
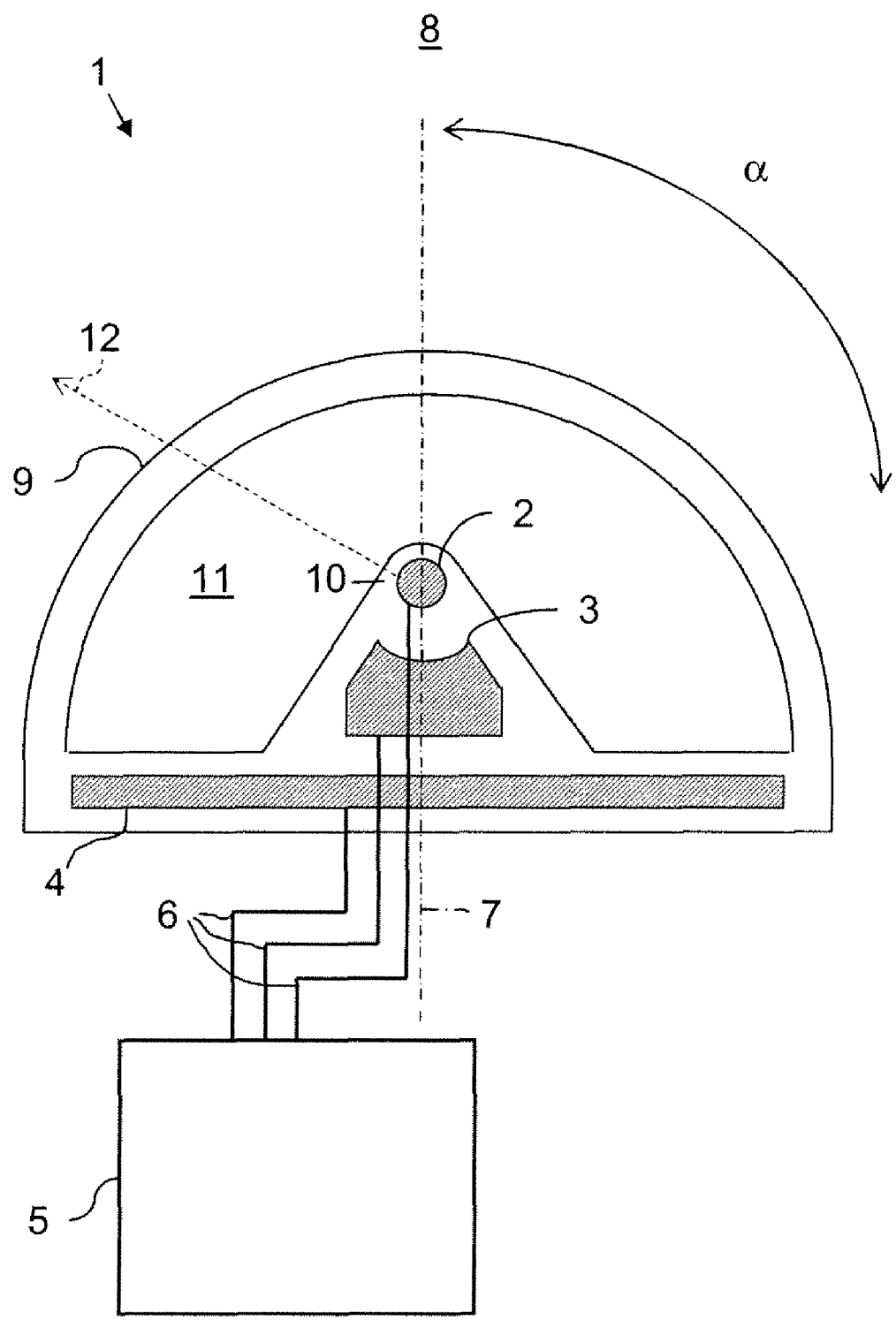
FIG. 1—a principle sketch of a cross-section of a sensor array in accordance with the invention and a connected control and evaluation circuit.

FIG. 1 shows a schematic depiction of a cross-section through a sensor array 1 in accordance with the invention with a connected control and evaluation circuit 5. The sensor array 1 is a profile that is extended longitudinally in the direction that is perpendicular to the diagram plane of FIG. 1. The sensor array 1 includes a sensor electrode 2 that extends longitudinally along a first coordinate line. The coordinate line progresses perpendicularly to the diagram plane of FIG. 1 and, for example, represents a coordinate line of a Cartesian coordinate system. The coordinate line does not have to be straight lined in other embodiments; it may also arch through space. For example the profile shown in FIG. 1 in section may be a flexible profile. The sensor electrode 2 has a circular cross-section in the exemplary embodiment shown in FIG. 1. In other exemplary embodiments, it may have a deviating, e.g. rectangular cross-section. A background electrode 4 is arrayed parallel to the sensor electrode 2. A shielding electrode 3 is positioned between the sensor electrode 2 and the background electrode 4. The sensor electrode 2, shielding electrode 3 and background electrode 4 are arrayed behind each other along a second coordinate line that is perpendicular to the first coordinate line. In the exemplary embodiment shown in FIG. 1, the second coordinate line runs vertically within the plane of the diagram.

The first coordinate line and the second coordinate line form a plane which is indicated by the dashed line 7 in FIG. 1.

In the exemplary embodiment shown in FIG. 1, the background electrode is formed by a level plate; the shielding electrode 3 that is arrayed between the sensor electrode 2 and the background electrode 4 is wider than the sensor electrode 2 in the direction that is perpendicular to the plane 7, however narrower than the background electrode 4.

FIG. 1 schematically indicates that the three electrodes 2, 3 and 4 are each connected to the control and evaluation circuit 5 via signal lines 6. For example, the background electrode 4 is connected to mass. The control and evaluation circuit 5 performs periodic charging and discharging of the sensor electrode 2 with a specified frequency and evaluates at least one parameter of the current or voltage progression that is dependent on the periodic charging and discharging the sensor electrode 2 to detect the changes in the capacity of the sensor electrode 2 as compared to mass. The shielding electrode 3 is connected to the sensor electrode 2 via the control and evaluation circuit 5 in such a manner that its potential largely follows the potential of the sensor electrode 2. The activation of the electrode array and the determination of the capacity changes can, for example, take place as described in Applicant's parallel pending German patent application No. 10 2009 031 824.0 with the title "Capacitive sensor array with a sensor electrode, a shielding electrode and a background electrode".

In order to fix the relative positions of the sensor electrode 2, the shielding electrode 3 and the background electrode 4 and electrically insulate the electrodes from their environment, the three electrodes are coated with an insulating layer, preferably a plastic layer. The plastic coating is arranged between the sensor electrode 2 and the detection range of the space 8 ahead of the sensor array 1 in the manner of a semicircular cylinder. The central axis of the cylinder lies approximately in level 7, which is formed by the first and second coordinate lines (the coating may also be arranged in a position that is slightly asymmetrical in relation to the plane 7). The detection range extends into the space 8 ahead of the sensor array 1 originating from the plane 7 by an angle a to the right and left of this plane, wherein the angle a defines the width of the detection range of the sensor array 1. For example the angle area a lies between 40° and 130° degrees to both sides of the plane 7. In the exemplary embodiment shown in FIG. 1, the angle area a in which the detection range extends to both sides of the plane 7 that is formed by the first and second coordinate lines equals approximately 90° degrees.

In the exemplary embodiment that is shown in FIG. 1, a hollow space 11 is formed within the plastic coating between a plastic layer 10 that immediately surrounds the sensor electrode 2 and an outer plastic layer 9, so that, for example, if one were to move along the dashed line 12 shown in FIG. 1 originating from the surface of the sensor electrode 2 in the direction of the detection range, the relative dielectricity constant of the insulator materials surrounding the sensor electrode 2 initially assumes a relatively high value of the plastic layer 10 surrounding the electrode 2, then drops to a value that approximates the value 1 in the space 11 (for example to the value of the dielectricity constant of air), and then rises again to a relatively high value of the outer plastic layer 9. The relative dielectricity constant of the plastic layers lies, for example, within a range of 2 to 5, specifically at approximately 4.

The profile of the sensor array that is shown in FIG. 1 has, for example, a length of a few centimeters up to approximately one meter. The width of the profile equals, for example, 15 mm and the height approximately 10 mm. The thickness of the outer plastic layer 9 is, for example, 1 mm. The sensor electrode 2 is, for example, covered with a plastic layer 10 that has a thickness of 0.5 mm. The width of the intervening space lies between approx. 4 mm and 2 mm.

The electrodes 2, 3 and 4 may, for example, consist of metal strips that are embedded into the plastic material. In a preferred embodiment, the electrodes consist of a conductive plastic. In a longer profile in which the electrodes 2, 3 and 4 are made from a conductive plastic, it may be provided that metal conduction wires are embedded within the electrodes. The electrodes 2, 3 and 4 are, for instance, connected with the wiring 6 to the control and evaluation circuit 5 at one end of the profile.

In the example shown in FIG. 1, the background electrode 4 extends across the entire width of the profile. This lends the profile additional stability.

The electrodes 2, 3 and 4 which are arrayed behind each other in the plane 7 may be formed and arranged in different ways. The electrodes 2, 3 and 4 may also each consist of several electrodes that are arranged in parallel.

Figures 2A, 2B:
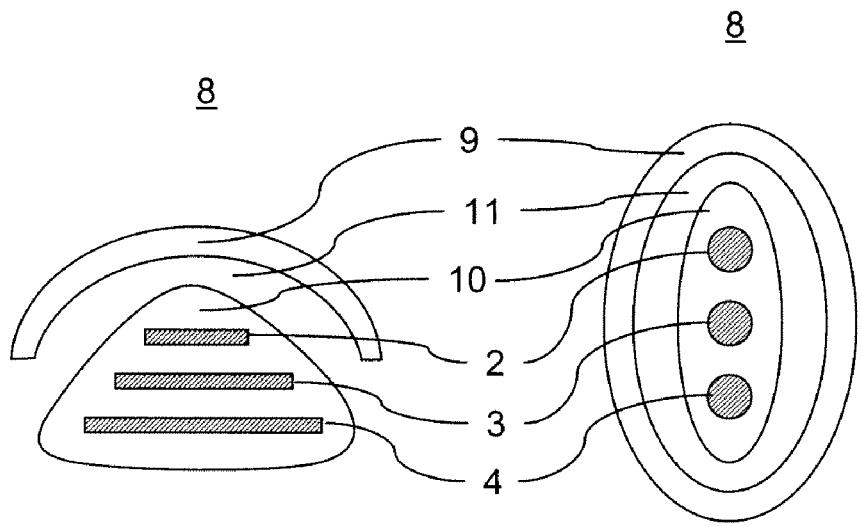
FIGS. 2A and 2B—schematic cross-sections through alternative cross-section forms and arrangements of the sensor electrodes.

FIGS. 2A and 2B schematically show further feasible arrangements of the three electrodes and the plastic layers that surround them. FIG. 2A shows a schematic arrangement of three electrodes 2, 3 and 4 that are formed as level plates, wherein the sensor electrode plate 2 consists of a strip with the lowest width, and the background electrode plate 4 consists of a strip with the greatest width. The three electrode strips are surrounded by a plastic layer 10 and fixed within it. Separated from this plastic layer 10 by a gap 11, an outer plastic layer 9 is arrayed between the sensor electrode 2 and the space 8 that contains the detection area.

FIG. 2B shows another option in which the three electrodes 2, 3 and 4 that are arranged behind each other along the second coordinate line are each formed as metal wires with a circular cross-section. The three electrode wires 2, 3 and 4 that are arranged in parallel with each other form an arrangement with the plastic layer 10 which approximately corresponds to that of a three-veined flat ribbon cable. At an interval formed by the space 11, the electrode array is surrounded by an outer plastic layer 9. The sensor array shown in FIG. 2B is symmetrical; that is, when the activation is changed, both the sensor that is shown in FIG. 2 above (as shown) and the electrode shown below may serve as sensor electrodes. The detection area may therefore extend both upwards into the space 8 and downwards.

Figures 3A, 3B:
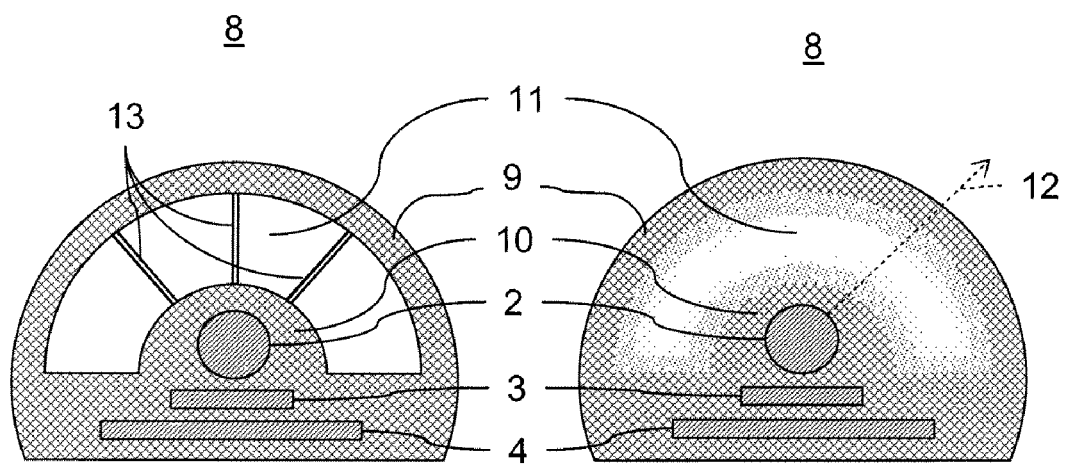
FIGS. 3A and 3B—schematic cross-sections through sensor arrays with alternative embodiments of the space between the plastic layer surrounding the sensor electrode and the outer plastic layer.

FIGS. 3A and 3B show schematic cross-sectional views through exemplary profiles of the sensor array in accordance with the invention. FIGS. 3A and 3B contain the same arrangement of the electrodes 2, 3 and 4. A sensor electrode 2 with a circular cross-section is arranged over a plate formed shielding electrode 3 with a slightly greater width, and this in turn is arranged over a plate formed background electrode 4 with the greatest width. The embodiment of the plastic coating as shown in FIG. 3A is similar to that of FIG. 1. However the space 11 contains several dividing walls 13 which radially progress along the profile towards the outside, and which lend the profile higher mechanical stability; in particular, they counteract inward compression of the outer plastic wall 9. The spaces 11 are, for instance, filled with air.

In the embodiment in accordance with FIG. 3B, the space between the outer plastic wall 9 and the plastic coating 10 of the sensor electrode 2 is filled with various plastic layers, wherein the inner plastic layers are foamed to increasing degrees. For example, the space 11 might be filled with a polyurethane or polystyrol foam (polystyrol foam has a relative dielectricity constant of approximately 1.03). If one moves along the arrow 12 in a radial outward direction starting from the surface of the sensor electrode 2, the plastic initially has a relatively high dielectricity constant (for example 4), whereupon the dielectricity constant initially drops from one plastic layer to the next, reaches a value of nearly 1 within the space 11, and then rises again layer by layer until the high value (for example 4) is reached again in the outer plastic layer 9.

Insofar as the sensor profile bars in accordance with the invention are to be flexible, a correspondingly flexible plastic will be used for the coating. Furthermore conductive plastic profiles which, if applicable, have metal conductors embedded within them may be used as sensor electrodes. All parts of the profile may, for instance, be coextruded.

The precise dimensions of the sensor profile, particularly the thicknesses of the plastic layers and the width of the intervening spaces, depend on the desired field of application, particularly the dimensions of the detection area. If such a sensor is, for example, used as a proximity sensor in the outer handle of a door, the detection range will extend no more than a few centimeters beyond the outer surface of the sensor. In this case, for example, the sensor array may possess a height of a few millimeters, wherein the space (for example an air gap) between the plastic layer 10 that surrounds the sensor electrode 2 and the outer plastic layer 9 only consists of 1 mm to 2 mm. The sensor array may furthermore, for example, be used in a sensor that detects the approach of a foot at the lower edge of the rear of a vehicle, wherein such a sensor array, referred to as a "foot switch", may, for example, trigger opening of the trunk or a rear hatch. In such a case, the detection range may, for example, extend approximately 20 cm from the surface of the sensor array 1. In this arrangement, the sensor profile has a height of—for example—one centimeter, and the space between the plastic layer 10 surrounding the sensor electrode 2 and the outer plastic layer here equals 3 mm to 5 mm.

We claim:

1. Capacitive sensor array comprising:
    a sensor electrode that extends along a first coordinate line to detect the entry of an object into a space ahead of the sensor electrode,
    a control and evaluation circuit linked to the sensor electrode and detects a capacity change in the capacity of the sensor electrode as compared to a reference potential by periodically charging and discharging the sensor electrode with a predetermined frequency and evaluating at least one parameter of a current or voltage progression that is dependent on the periodic charging and discharging of the sensor electrode in order to detect the capacity change,
    a background electrode that extends parallel to the sensor electrode,
    a shielding electrode that is arranged between the sensor electrode and the background electrode and linked to the sensor electrode via the control and evaluation circuit in such a manner that its potential follows the potential of the sensor electrode,
    wherein the sensor electrode, the shielding electrode and the background electrode are arranged behind each other along a second coordinate line that is perpendicular to the first coordinate line,
    wherein a detection area of the sensor array extends into the direction of the second coordinate line into the space ahead of the sensor electrode and within a specified angle area (a) on both sides of a plane that is formed by the first and second coordinate lines, wherein the sensor electrode is surrounded by insulating materials which are arrayed between the sensor electrode and the detection zone in a semicircular or semi-elliptical cylinder, wherein the central axis of the cylinder lies within the plane that is formed by the first and second coordinate lines, wherein the insulator materials between the detection zone and the sensor electrode include at least one plastic layer of a first thickness that directly surrounds the sensor electrode and an outer plastic layer of a second thickness that is arrayed at a predetermined distance from the at least one plastic layer, wherein the insulator materials are arranged so that the relative dielectricity constant initially assumes a relatively high value of the at least one plastic layer as the distance from the sensor electrode increases, then drops to a value that approaches the value of 1 and then again rises to a relatively high value of the outer plastic layer.

2. Capacitive sensor array in accordance with claim 1, wherein there is a gas filled space between the at least one plastic layer surrounding the sensor electrode and the outer plastic layer, whose width corresponds to the predetermined distance and whose relative dielectricity constant approximates the value of 1.

3. Capacitive sensor array in accordance with claim 2, wherein the gas filled space is formed by an air gap or several air gaps with at least one of radial and cylindrical plastic dividing walls.

4. Capacitive sensor array in accordance with claim 2, wherein the gas filled space is formed by a foamed plastic area.

5. Capacitive sensor array in accordance with claim 1, wherein at least one of the at least one plastic layer surrounding the sensor electrode and the outer plastic layer include a plurality of plastic layers.

6. Capacitive sensor array in accordance with claim 1, wherein a distance between the at least one plastic layer surrounding the sensor electrode and the outer plastic layer lies within the range of 30% to 90% of the distance of the outer surface of the outer plastic layer from the surface of the sensor electrode.

7. Capacitive sensor array in accordance with claim 1, wherein the first thickness and the second thickness lie within the range between 0.2 mm and 2 mm.

8. Capacitive sensor array in accordance with claim 1, wherein the predetermined distance between the at least one plastic layer surrounding the sensor electrode and the outer plastic layer lies within the range of 0.5 mm and 10 mm.

9. Capacitive sensor array in accordance with claim 1, wherein the detection area of the sensory array extends within the specified angle area (a) ranging from 40° to 130° to both sides of the plane formed by the first and second coordinate lines.

10. Capacitive sensor array in accordance with claim 1, wherein the sensor electrode on the side facing the shielding electrode as well as the shielding electrode and the background electrode are surrounded by a plastic mantle, wherein the plastic mantle supports the electrodes and fixes their position.

11. Capacitive sensor array in accordance with claim 1, wherein the background electrode is formed as a level plate that is symmetrically arranged at a plane that is perpendicular to the second coordinate line behind the sensor electrode.

12. Capacitive sensor array in accordance with claim 11, wherein the background electrode extends into the direction that is perpendicular to the first and second coordinate lines to the outer plastic layer of the insulator materials that are arranged in the semicircular or semi-elliptical cylinder.

13. Capacitive sensor array in accordance with claim 11, wherein the shielding electrode possesses a width in the direction that is perpendicular to the first and second coordinate lines which is greater than that of the sensor electrode, and less than that of the background electrode.

14. Capacitive sensor array in accordance with claim 1, wherein the reference potential is ground and the background electrode is a ground electrode.

15. Capacitive sensor array in accordance with claim 1, wherein the predetermined frequency lies within the range from 50 kHz to 5 MHz.

* * * * *